(12) United States Patent
Pu et al.

(10) Patent No.: US 12,250,837 B2
(45) Date of Patent: Mar. 11, 2025

(54) PIXEL STRUCTURE, ARRAY SUBSTRATE AND FABRICATION METHOD THEREOF

(71) Applicant: HKC CORPORATION LIMITED, Shenzhen (CN)

(72) Inventors: Yang Pu, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 197 days.

(21) Appl. No.: 18/065,133

(22) Filed: Dec. 13, 2022

(65) Prior Publication Data
US 2023/0352490 A1    Nov. 2, 2023

(30) Foreign Application Priority Data
Apr. 29, 2022  (CN) .......................... 202210463909.5

(51) Int. Cl.
*G02F 1/1362* (2006.01)
*G02F 1/1368* (2006.01)
(Continued)

(52) U.S. Cl.
CPC ....... *H10D 86/60* (2025.01); *G02F 1/136286* (2013.01); *G02F 1/1368* (2013.01); *H10D 86/0221* (2025.01); *H10D 86/423* (2025.01)

(58) Field of Classification Search
CPC .. H10D 86/60; H10D 86/0221; H10D 86/423; H10D 30/0316; H10D 30/0321;
(Continued)

(56) References Cited

U.S. PATENT DOCUMENTS

| 2007/0013633 | A1  | 1/2007 | Kamada et al. |
| 2010/0085498 | A1* | 4/2010 | Chen .................. G02F 1/13624 349/39 |

(Continued)

FOREIGN PATENT DOCUMENTS

| CN | 103022145 A | 4/2013 |
| CN | 104599656 A | 5/2015 |

(Continued)

OTHER PUBLICATIONS

Office Action issued on Oct. 1, 2024, in corresponding Japanese Application No. 2023-556896, 4 pages.

*Primary Examiner* — Charles S Chang
(74) *Attorney, Agent, or Firm* — Maier & Maier, PLLC

(57) ABSTRACT

A pixel structure includes: a gate electrode disposed on a base substrate; a gate insulation layer covering the gate electrode; a source electrode, an active region, a drain electrode, a first doped region and a secondary electrode metal layer disposed on an upper surface of the gate insulation layer sequentially; two second doped regions at two ends of an upper surface of the active region; and a passivation layer covering source electrode, a portion of the active region exposed to the second doped regions, the second doped regions, the drain electrode, the first doped region and the secondary electrode metal layer. The passivation layer is provided with a primary pixel electrode and a secondary pixel electrode disposed thereon, the primary pixel electrode is connected to the drain electrode, and the secondary pixel electrode is connected to the secondary electrode metal layer.

14 Claims, 6 Drawing Sheets

(51) Int. Cl.
 *H10D 86/01* (2025.01)
 *H10D 86/40* (2025.01)
 *H10D 86/60* (2025.01)

(58) Field of Classification Search
 CPC ............ H10D 30/6745; H10D 86/481; H10D 86/421; H10D 86/441; H10D 27/127; G02F 1/1362; G02F 1/136286; G02F 1/1368; G02F 1/13439; G02F 1/134345
 USPC ...................................................... 349/42–46
 See application file for complete search history.

(56) References Cited

U.S. PATENT DOCUMENTS

2015/0002497 A1* 1/2015 Dong .................. G09G 3/3655
 345/87
2018/0364531 A1 12/2018 Kimura

FOREIGN PATENT DOCUMENTS

| CN | 107068613 A | 8/2017 |
| CN | 109148504 A | 1/2019 |
| CN | 113671761 A | 11/2021 |
| JP | 2006184516 A | 7/2006 |
| JP | 2008287115 A | 11/2008 |
| JP | 2013105873 A | 5/2013 |

* cited by examiner

PIXEL STRUCTURE, ARRAY SUBSTRATE AND FABRICATION METHOD THEREOF

CROSS-REFERENCE TO RELATED APPLICATION

Pursuant to 35 U.S.C. § 119 and the Paris Conversion, this application claims priority to Chinese Patent Application No. 202210463909.5 filed Apr. 29, 2022, the entire contents of which are incorporated herein by reference.

FIELD

The present application relates to the technical field of displaying technologies, and more particularly to a pixel structure, an array substrate and a fabrication method thereof.

BACKGROUND

The statements provided herein are merely background information related to the present application, and do not necessarily constitute any prior arts. Thin film transistor-liquid crystal display (Thin Film Transistor-Liquid Crystal Display, TFT-LCD) has a plurality of common display modes such as a twisted nematic (Twisted Nematic, TN) display mode, a vertical alignment (Vertical Alignment, VA) display mode, a fringe field switching (Fringe Field Switching, FFS) display mode, an in-plane switching (In-Plane Switching, IPS) display mode, and the like. The VA mode has better dark state performance and better contrast ratio with respect to other display modes. However, a viewing angle of the VA mode of the TFT-LCD is relatively bad.

Currently, a method of dividing a pixel into multiple domains (e.g., 8 domains or 4 domains) is commonly used to improve the viewing angle of displaying in the VA mode. As for the pixel divided into 8 domains, the liquid crystal has 8 orientations. As for the pixel divided into 4 domains, the liquid crystal has 4 orientations. A method for forming a pixel with 4 domains generally includes: forming slits on a pixel electrode, and forming protrusions on a color filter substrate. Liquid crystal molecules may have pre-tilt angles in different directions when voltages are not exerted on the liquid crystal molecules. After the voltages are exerted on the liquid crystal molecules, a liquid crystal layer may be divided into four liquid crystal microdomains which have different tilt directions respectively, thereby achieving a large-viewing-angle display feature. Generally, a method for forming a pixel with 8 domains is realized by dividing one pixel into a primary sub-pixel and a secondary sub-pixel based on the method for forming a pixel with 4 domains, where the primary sub-pixel and the secondary sub-pixel have 4 domains respectively. Moreover, the primary sub-pixel and the secondary sub-pixel have different driving voltages. Thus, there are respectively different liquid crystal deflection angles, the rotation angles of the liquid crystals are not in the same direction during large-viewing-angle viewing, there is a perfect accumulated effect for a human eye, a problem of color cast is perfectly solved, and a color cast can be further improved, and a large-viewing-angle is provided.

In the prior art, multiple TFTs need to be used for controlling a 8-domain VA display structure. For example, two TFTs are respectively used to control the primary sub-pixel and the secondary sub-pixel, and a third TFT is used to partially discharge the secondary sub-pixel during maintenance of the voltage of the secondary sub-pixel. As an alternative, the third TFT is omitted, only two TFTs are used. The structure of multiple TFTs and fabrication of the multiple TFTs are relatively complex, and the cost of fabrication is improved.

Thus, in the technical solution of the conventional 8-domain VA display structure, the 8-domain VA display structure having multiple TFTs and the fabrication of the 8-domain VA display structure having the multiple TFTs are relatively complex, so that the cost of fabrication of the 8-domain VA display structure is improved.

SUMMARY

The objective of the present application is to provide a pixel driving circuit, an array substrate and a fabrication method of the array substrate, which aim at solving the problem that the structure of the conventional 8-domain VA display structure having multiple TFTs and the fabrication of the 8-domain VA display structure having the multiple TFTs are relatively complex, so that the cost of fabrication is improved.

In the first aspect, a pixel structure is provided in one embodiment of the present application, the pixel structure includes:
  a gate electrode disposed on an upper surface of a base substrate;
  a gate insulation layer covering the gate electrode, the gate insulation layer further covers the upper surface of the base substrate excluding the gate electrode;
  a source electrode, an active region, a drain electrode, a first doped region and a secondary electrode metal layer which are sequentially disposed on an upper surface of the gate insulation layer in a transverse direction parallel to the base substrate, where the active region is arranged in a region on an upper surface of the gate electrode;
  two second doped regions at two ends of an upper surface of the active region, where one of the second doped regions at one end of the upper surface of the active region is connected to the source electrode, the other one of the second doped regions at the other end of the upper surface of the active region is connected to the drain electrode, and a doping concentration of the first doped region is less than a doping concentration of each of the second doped regions; and
  a passivation layer covering the source electrode, a portion of the active region exposed to the second doped regions, the two second doped regions, the drain electrode, the first doped region and the secondary electrode metal layer. Where the passivation layer is provided with a primary pixel electrode and a secondary pixel electrode disposed thereon, the primary pixel electrode is connected to the drain electrode, and the secondary pixel electrode is connected to the secondary electrode metal layer.

In one embodiment, the first doped region comprises two first heavily doped regions and a first lightly doped region.

The two first heavily doped regions are distributed at two ends of the first lightly doped region in the transverse direction parallel to the base substrate, one of the two first heavily doped regions distributed at one end of the first lightly doped region is connected to the drain electrode, and the other one of the two first heavily doped regions distributed at the other end of the first lightly doped region is connected to the secondary electrode metal layer.

In one embodiment, a doping concentration of each of the first heavily doped regions is equal to a doping concentration of each of the two second doped regions.

In one embodiment, a doping concentration of each of the first heavily doped regions is greater than a doping concentration of the first lightly doped region.

In one embodiment, a doping type of the first doping region and a doping type of each of the second doping regions are P-type doping.

In the second aspect, an array substrate is provided in one embodiment of the present application, the array substrate includes:
  a base substrate; and
  a plurality of scanning lines, a plurality of data lines and a plurality of pixel units disposed on the base substrate. The scanning lines and the data lines define a plurality of pixel regions, and each of the pixel regions includes a primary pixel region and a secondary pixel region.

The pixel unit includes the pixel structure described in the first aspect. Where the gate electrode is connected to one of the scanning lines, the source electrode is connected to one of the data lines, the primary pixel electrode is arranged in the primary pixel region, and the secondary pixel electrode is arranged in the secondary pixel region.

In the third aspect, a method for fabricating an array substrate is provided in one embodiment of the present application, the method includes:
  forming a gate electrode on an upper surface of a base substrate;
  forming a gate insulation layer on the gate electrode and the upper surface of the base substrate excluding the gate electrode;
  forming an active region on an upper surface of the gate insulation layer, where the active region is located on an upper surface of the gate insulation layer disposed on an upper surface of the gate electrode;
  forming two second doped regions at two ends of an upper surface of the active region, and forming a first doped region on the upper surface of the gate insulation layer and being spaced from with the active region and the second doped regions;
  forming a source electrode, a drain electrode and a secondary electrode metal layer on the upper surface of the gate insulation layer, where one of the second doped regions at one end of the upper surface of the active region is connected to the source electrode, the other one of the second doped regions at the other end of the upper surface of the active region is connected to a first end of the drain electrode, a second end of the drain electrode is connected to a first end of the first doped region, and a second end of the first doped region is connected to the secondary electrode metal layer; and
  forming a passivation layer on the source electrode, the active region, the two second doped regions, the drain electrode, the first doped region and the secondary electrode metal layer, disposing a primary pixel electrode and a secondary pixel electrode on the passivation layer, connecting the primary pixel electrode with the drain electrode, and connecting the secondary pixel electrode with the secondary electrode metal layer.

In one embodiment, said forming two second doped regions at two ends of an upper surface of the active region, and forming a first doped region on the upper surface of the gate insulation layer and being spaced from with the active region and the second doped regions includes:
  forming two first heavily doped regions in the first doped region;
  forming the two second doped regions at the two ends of the upper surface of the active region using a chemical vapor deposition method, and forming two first heavily doped regions on the upper surface of the gate insulation layer and being spaced from the active region and the second doped region;
  forming one first lightly doped region between the two first heavily doped regions using the chemical vapor deposition method, wherein a doping concentration of each of the two first heavily doped regions is equal to a doping concentration of each of the two second doped regions.

In one embodiment, gases used in the chemical vapor deposition method include hydrogen phosphide and methylsilane;
  a first ratio M of a gas flow in the first heavily doped regions and the second doped regions to a gas flow of the methylsilane meets a first preset ratio range; and
  the first preset ratio range is expressed as $1:2.0 \leq M \leq 1:1.5$.

In one embodiment, a second ratio N of a gas flow of the phosphine in the first lightly doped region to the gas flow of the methylsilane meets a second preset ratio range; and
  the second preset ratio range is expressed as $1:0.5 \leq N \leq 1:0.1$.

As compared to the related art, according to the embodiments of the present application, the following beneficial effects can be achieved:

In the embodiments of the present application, the drain electrode of the thin film transistor is directly connected to the primary pixel electrode, and the drain electrode of the thin film transistor is further connected to the secondary pixel electrode through the first doped region. According to the arrangement of the first doped region of the pixel structure with a low doping concentration, the resistance between the drain electrode and the secondary pixel electrode of the thin film transistor is increased due to the low doping concentration of the first doped region, so that the resistance between the drain electrode and the secondary pixel electrode of the thin film transistor is greater than the resistance between the drain electrode and the primary pixel electrode. Since the resistance generated in the first doped region with the low doping concentration between the drain electrode and the secondary pixel electrode of the thin film transistor has a voltage dividing effect on data signal voltage, such that the data signal voltage obtained by the secondary pixel electrode is smaller than the data signal voltage obtained by the primary pixel electrode, and the liquid crystal deflection angle of the secondary pixel region is smaller than the liquid crystal deflection angle of the primary pixel region. Thus, one thin film transistor can be used to control 8-domain VA displaying. The number of TFTs and the steps for fabricating the TFTs are reduced while a large-angle viewing angle range is guaranteed, the complexity of the structure of the pixel structure and the cost of fabrication of the pixel structure are reduced accordingly.

DETAILED DESCRIPTION OF THE EMBODIMENTS

In order to make the technical problem to be solved by the present application, the technical solutions and the beneficial effects of the present application be clearer and more understandable, the present application will be further described in detail below with reference to accompanying figures and the embodiments. It should be understood that the embodiments described in detail herein are merely intended to illustrate but not to limit the present application.

It needs to be noted that, when one component is described to be "fixed to" or "arranged on" another component, this component may be directly or indirectly arranged on another component. When it is described that one component "is connected to" another component, this component may be directly or indirectly connected to another component.

Orientation or position relationships indicated by terms including "upper", "lower", "left" and "right" are based on the orientation or position relationships shown in the accompanying figures and is only used for the convenience of description, instead of indicating or implying that the indicated device or element must have a specific orientation and is constructed and operated in a particular orientation, and thus should not be interpreted as limitation to the present application.

Terms of "the first" and "the second" are only for the purpose of describing conveniently and should not be interpreted as indicating or implying relative importance or implicitly indicating the number of indicated technical features. "Multiple/a plurality of" means two or more unless there is an additional explicit and specific limitation.

The descriptions of "referring to one embodiment" and "referring to some embodiments", and the like as described in the specification of the present application means that a specific feature, structure, or characters which are described with reference to this embodiment are included in one embodiment or some embodiments of the present application. Thus, the sentences of "in one embodiment", "in some embodiments", "in some other embodiments", "in other embodiments", and the like in this specification are not necessarily referring to the same embodiment, but instead indicate "one or more embodiments instead of all embodiments", unless there is a special emphasis in other manner otherwise. The terms "comprising", "including", "having" and their variations mean "including but is not limited to", unless there is a special emphasis in other manner otherwise.

Figure 1:
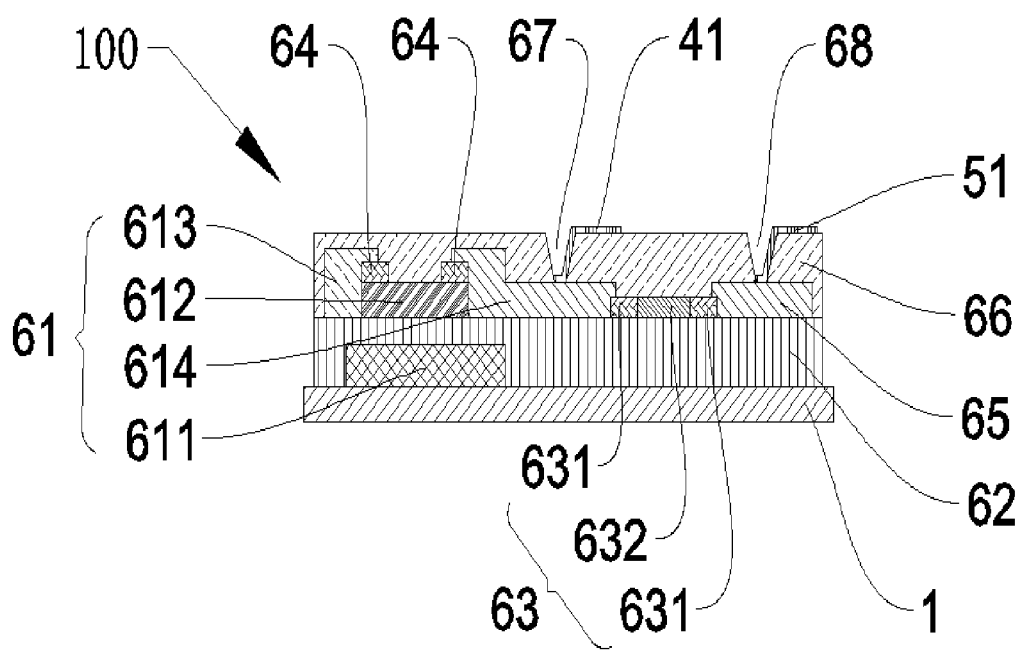
FIG. 1 illustrates a schematic diagram of a profile of a pixel structure according to one embodiment of the present application.

As shown in FIG. 1, a pixel structure 100 is provided in one embodiment of the present application, the pixel structure 100 includes:

a gate electrode 611 disposed on an upper surface of the base substrate 1; a gate insulation layer 62 that covers the gate electrode 611, the gate insulation layer 62 further covers the upper surface of the base substrate 1 excluding the gate electrode 611; a source electrode 613, an active region 612, a drain electrode 614, a first doped region 63 and a secondary electrode metal layers 65 which are sequentially arranged in a transverse direction parallel to the base substrate 1. Where the active region 612 is arranged in a region on an upper surface of the gate electrode 611. The pixel structure 100 further includes two second doped regions 64 arranged at two ends of an upper surface of the active region 612, where one of the second doped regions 64 disposed at one end of the upper surface of the active region 612 is connected to the source electrode 613, the other one of the second doped regions 64 disposed at the other end of the upper surface of the active region 612 is connected to the drain electrode 614, and a doping concentration of the first doped region 63 is less than a doping concentration of each of the second doped region 64. The pixel structure further includes a passivation layer 66 that covers the source electrode 613, a region of the upper surface of the active region 613 which are not covered by the second doped regions 64, the two second doped regions 64, the drain electrode 614, the first doped region 63, and the secondary electrode metal layer 65. The passivation layer 66 is provided with a first via 67 penetrating to the drain electrode 614 and a second via 68 penetrating to the secondary electrode metal layer 65. The drain electrode 614 is connected to the primary pixel electrode 41 via the first via 67, and the secondary electrode metal layer 65 is connected to the secondary pixel electrode 51 via the second via 68.

In some embodiments, the gate electrode 611, the source electrode 613 and the drain electrode 614 are all metal layers, both the source electrode 613 and the drain electrode 614 are arranged on the upper surface of the gate insulation layer 62, and are connected to the active region 612 which is arranged on the upper surface of the gate insulation layer 62. The passivation layer 66 arranged on the upper surface of the active region 612 separates the source electrode 613 from the drain electrode 614. The gate electrode 611 is separated from the source electrode 613 and the drain electrode 614 by the gate insulation layer 62. Where the gate electrode 611, the source electrode 613 and the drain electrode 614 may be made of any electrical good conductor material. For example, the gate electrode 611, the source electrode 613 and the drain electrode 614 may be made of at least one material of aluminum (Al), copper (Au), silver (Ag), molybdenum (Mo), or be made of an alloy material formed by any combination of aluminum (Al), copper (Au), silver (Ag) and molybdenum (Mo).

In some embodiments, the gate electrode 611 is further used as a scanning line 2. The active region 612 is composed of amorphous silicon (A-Si) or polysilicon. As an alternative, the active region 612 is composed of indium gallium zinc oxide (Indium Gallium Zinc Oxide, IGZO) of a metal oxide semiconductor.

In some embodiments, the gate insulation layer 62 and the passivation layer 66 (PVX) may be composed of any electrical poor conductor material. For example, the gate insulation layer 62 and the passivation layer 66 (PVX) are composed of at least one of the materials of silicon nitride layer and silicon oxide layer. The gate insulation layer 62 serves to enable the gate electrode 611 to be isolated, the passivation layer 66 not only serves as a protective layer having certain strength, but also has an insulation function.

In some embodiments, the second doped regions 64 are heavily doped regions, which facilitates a formation of ohmic contact, reduces a contact resistance between the active region 612 formed by a semiconductor material, and the source electrode 613 and the drain electrode 614. Furthermore, the doping concentration of the first doped region 63 is less than the doping concentration of each of the second doped regions 64, so that the resistance of the first doped region 63 is greater than that of the second doped region 64, and a voltage dividing function during operation is facilitated.

In some embodiments, the first doped region 63 includes two first heavily doped regions 631 and a first lightly doped region 632. In a transverse direction parallel to the base substrate, the two first heavily doped regions 631 are distributed at two ends of the first lightly doped region 632, one of the two first heavily doped regions 631 distributed at one end of the first lightly doped region 632 is connected to the drain electrode 614, and the other one of the first heavily doped regions 631 distributed at the other end of the first lightly doped region 632 is connected to the secondary electrode metal layer 65. Where the first heavily doped regions 631 distributed at the two ends of the first lightly doped region 632 form an ohmic contact, so that the contact resistance between the first doped region 63, the drain electrode 614 and the secondary electrode metal layer 65 can be reduced.

In some embodiments, the doping concentration of each first heavily doped region 631 is equal to the doping concentration of each second doped region 64, and the doping concentration of each first heavily doped region 631 is greater than the doping concentration of the first lightly doped region 632. The doping concentration of the first heavily doped region 631 is equal to the doping concentration of the second doped region 64, so that the reduction of the complexity of deposition process and the reduction of deposition time are facilitated. The doping concentration of each first heavily doped region 631 is greater than the doping concentration of the first lightly doped region 632, so that the formation of ohmic contact is facilitated, and the contact resistance between the first doped region 63, the drain electrode 614 and the secondary electrode metal layer 65 can be reduced.

In some embodiments, both the doping type of the first doping region 63 and the doping type of the second doping region 64 are P-type doping, and the P-type doping facilitates switching control of the thin film transistor 61.

Figure 2:
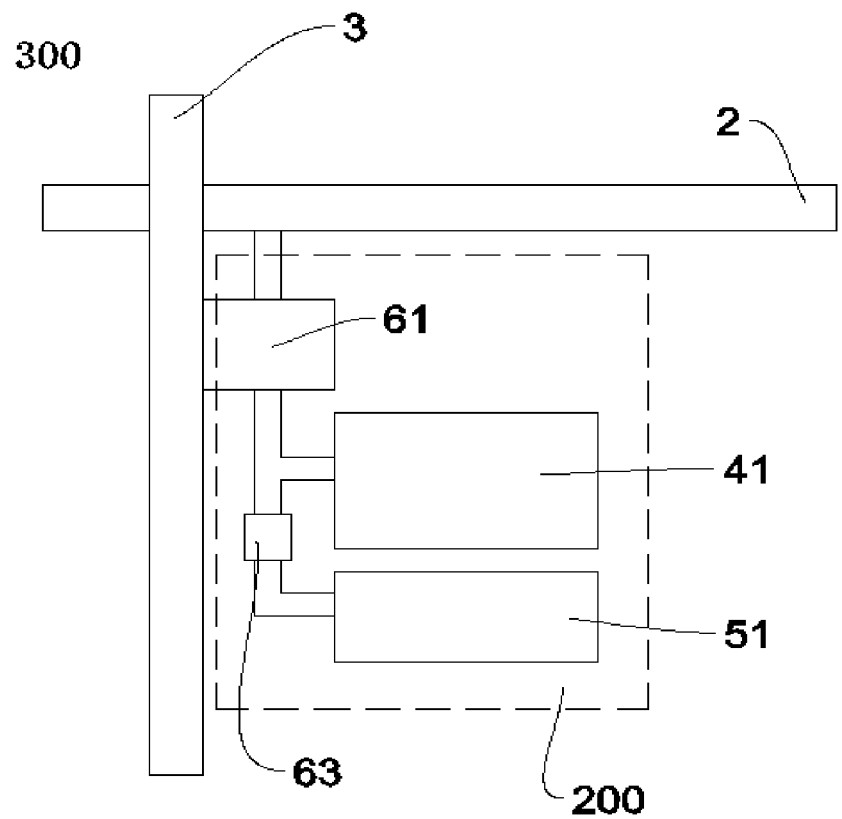
FIG. 2 illustrates a schematic structure of an array substrate according to one embodiment of the present application.

As shown in FIG. 2, according to a second aspect of the embodiments of the present application, an array substrate 300 is provided, the array substrate includes:

a base substrate 1; and a plurality of scanning lines 2, a plurality of data lines 3 and a plurality of pixel units 200 disposed on the base substrate 1. The scanning lines 2 and the data lines 3 define a plurality of pixel regions, and each of the plurality of pixel regions includes a primary pixel region 4 and a secondary pixel region 5.

The pixel unit 200 includes the pixel structure 100. Where the gate electrode 611 is connected to one of the scanning lines 2, the source electrode 613 is connected to one of the data lines 3, the primary pixel electrode 41 is arranged in the primary pixel region 4, and the secondary pixel electrode 51 is arranged in the sub-pixel region 5. Where the gate electrode 611, the active region 612, the source electrode 613 and the drain electrode 614 are constituted as the thin film transistor 61. It may be understood that, FIG. 2 and FIG. 3 illustrate one pixel unit 200, one scanning line 2, and one data line 3 merely.

Figure 3:
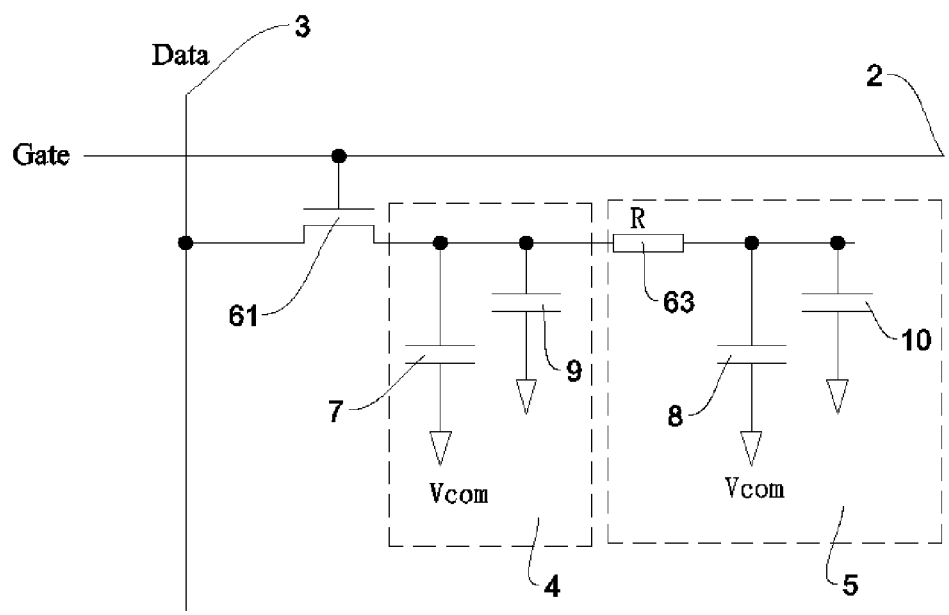
FIG. 3 illustrates a schematic circuit configuration of an equivalent circuit of the array substrate provided by one embodiment of the present application.

As shown in FIG. 3, the gate electrode 611 of the thin film transistor 61 receives a scanning voltage (Scan) from the scanning line 2, and the gate electrode 611 of the thin film transistor 61 controls the thin film transistor 61 to be switched on or switched off according to the scanning voltage from the scanning line 2. When the thin film transistor 61 is switched on, the data voltage (Data) from the data line 3 can be exerted on the primary pixel electrode 41, a voltage between the primary pixel electrode 41 and an upper common electrode (not shown, the common electrode is used for providing a voltage Vcom) on the opposite side is exerted on a liquid crystal layer (not shown in the figures) between the primary pixel electrode 41 and the common electrode, so that a first liquid crystal capacitance 7 is formed. The data voltage (Data) from the data line 3 charges the first liquid crystal capacitance 7, thereby driving the corresponding liquid crystal molecules in the primary pixel region 4 to be rotated. When the thin film transistor 61 is switched on, the data voltage (Data) from the data line 3 can be exerted on the secondary pixel electrode 51, a voltage between the primary pixel electrode 41 and a common electrode (not shown in the figures, the common electrode is used for providing a voltage Vcom) on the opposite side is exerted on a liquid crystal layer (not shown in the figures) between the primary pixel electrode 41 and the common electrode, so that a second liquid crystal capacitance 8 is formed. The data voltage (Data) from the data line 3 charges the second liquid crystal capacitance 8, thereby driving the corresponding liquid crystal molecules in the secondary pixel region 5 to be rotated.

As shown in FIG. 3, when the data voltage (Data) from the data line 3 charges the second liquid crystal capacitance 8, the data voltage needs to flow through an equivalent resistor R formed by the first doped region 63, where the equivalent resistor R has a voltage division function, and a part of the data voltage (Data) from the data line 3 will be exerted on the equivalent resistor R, so that the data voltage of the secondary pixel region 5 is smaller than the data voltage of the primary pixel region 4, the degree of deflection of the liquid crystal molecules in the secondary pixel region 5 is different from the degree of deflection of the liquid crystal molecules in the primary pixel region 4. Thus, both the primary pixel electrode 41 and the secondary pixel electrode 51 are set as a 4-domain pixel structure, a 8-domain pixel structure can be realized based on one TFT (i.e., the thin film transistor 61), the number of the TFTs in the pixel structure 100 and the steps for fabricating the TFTs are reduced, both the complexity of the structure and the cost of fabrication of the pixel structure 100 are reduced.

In some embodiments, when the doping concentration of the first doped region 63 is less than the doping concentration of each second doped region 64, the resistance of the first doped region 63 is greater than the second doped region 64, the doping concentration of the first doped region 63 can be adjusted according to the requirement of the viewing angle of the VA display structure, the degree of deflection of the liquid crystal molecules in the secondary pixel region 5 can be adjusted by changing a value of a divided voltage of the first doped region 63, so that a better large-angle-display viewing angle is achieved.

In some embodiments, the second doped region 64 is a metal layer, so that the deposition time is reduced, and the cost of fabrication of the pixel structure 100 is reduced.

Compared with the prior art, according to this embodiment of the present application, the following beneficial effects can be achieved:

According to the pixel structure and the array substrate provided by this embodiment, the drain electrode of the thin film transistor is directly connected to the primary pixel electrode, and the drain electrode of the thin film transistor is further connected to the secondary pixel electrode through the first doped region. According to the arrangement of the first doped region of the pixel structure with a low doping concentration, the resistance between the drain electrode and the secondary pixel electrode of the thin film transistor is increased due to the low doping concentration of the first doped region, so that the resistance between the drain electrode and the secondary pixel electrode of the thin film transistor is greater than the resistance between the drain electrode and the primary pixel electrode. Since the resistance generated in the first doped region with the low doping concentration between the drain electrode and the secondary pixel electrode of the thin film transistor has a voltage dividing effect on data signal voltage, so that the data signal voltage obtained by the secondary pixel electrode is smaller than the data signal voltage obtained by the primary pixel electrode, the liquid crystal deflection angle of the secondary pixel region is smaller than the liquid crystal deflection angle of the primary pixel region. Thus, one thin film transistor can be used to control 8-domain VA displaying, the number of TFTs and the steps for fabricating the TFTs are reduced while a large-angle viewing angle range is guaranteed, both the complexity of the structure and the cost of fabrication of the pixel structure 100 are reduced.

As for a display panel having the pixel structure and the array substrate according to this embodiment of the present application, only one TFT is used to realize the 8-domain VA display, the number of TFTs and the steps for fabricating the TFTs are reduced while the large-angle viewing angle range is guaranteed. The display panel has a low complexity of structure and a low fabrication cost. Since the number of TFTs of the display panel is reduced, the effective display area of a single pixel unit is further increased, so that the luminance of the display panel is improved.

Figure 4:
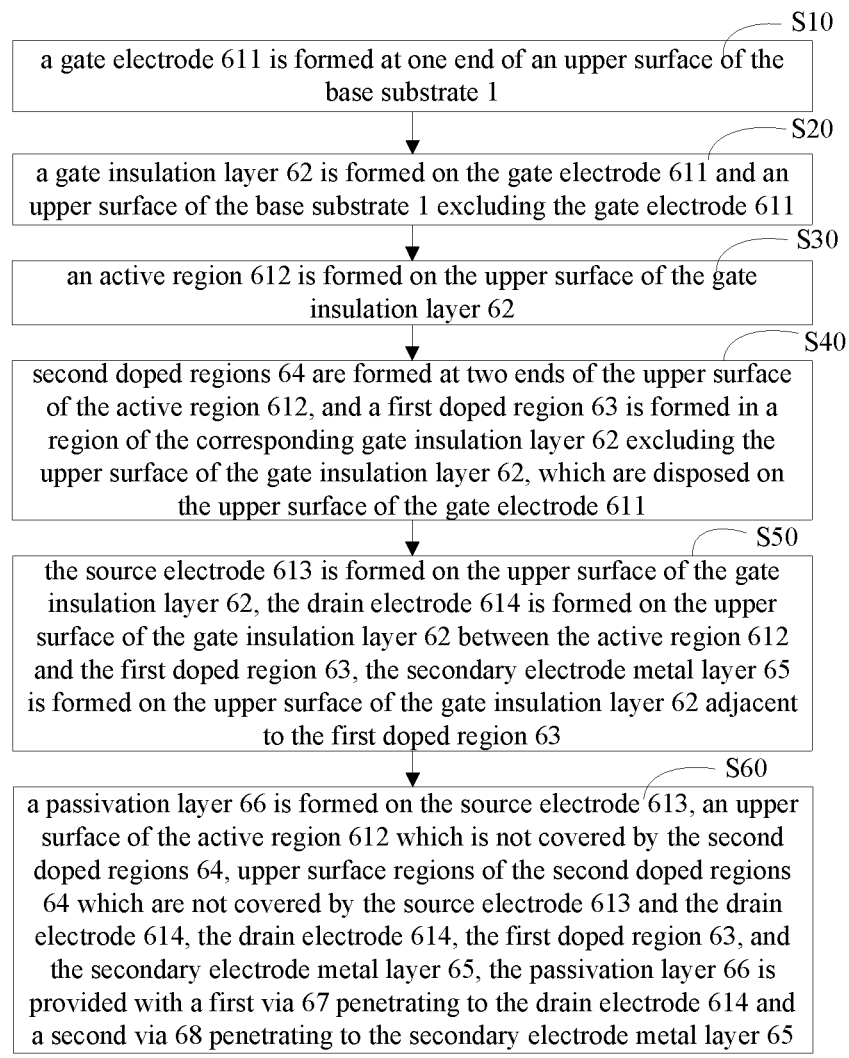
FIG. 4 illustrates a schematic flow diagram of a method for fabricating the array substrate according to one embodiment of the present application.
Figure 5:
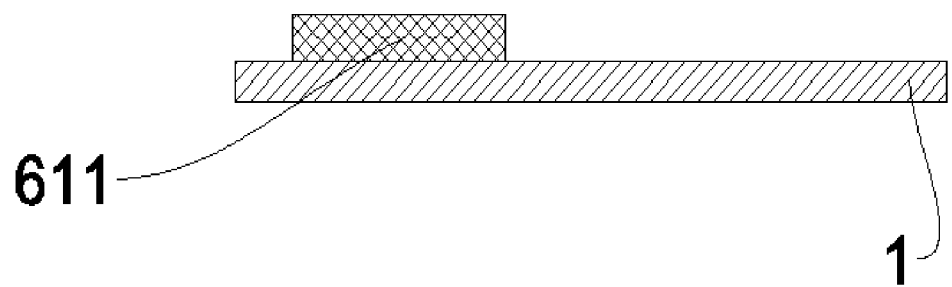
FIG. 5 illustrates a schematic profile diagram corresponding to a step S10 in the method for fabricating the array substrate according to one embodiment of the present application.

As shown in FIG. 4, according to a third aspect of the embodiment of the present application, a method for fabricating an array substrate 300 is provided. The method includes:

At step S10, as shown in FIG. 5, a gate electrode 611 is formed at one end of an upper surface of the base substrate 1.

In some embodiments, the first metal layer is formed on the base substrate 1 through a physical vapor deposition method, and the material of the first metal layer includes at least one of aluminum and molybdenum. Then, the gate electrode 611 is formed through masking and photoetching treatments. The gate electrode 611 is also used as the scanning line 2.

Figure 6:
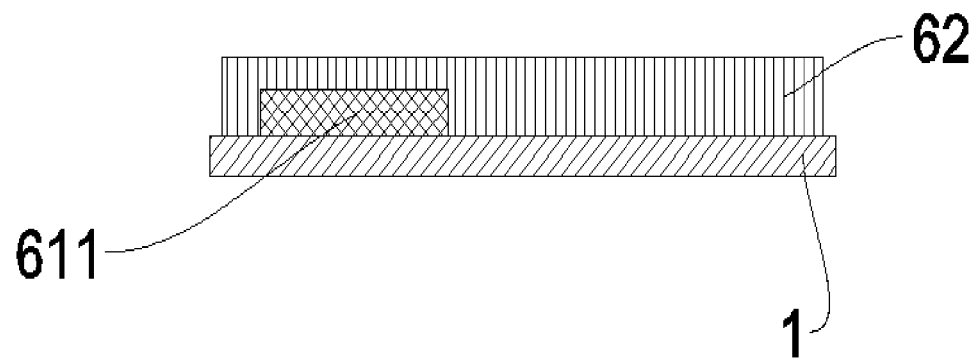
FIG. 6 illustrates a schematic profile diagram corresponding to a step S20 in the method for fabricating the array substrate according to one embodiment of the present application.

At step S20, as shown in FIG. 6, a gate insulation layer 62 is formed on the gate electrode 611 and an upper surface of the base substrate 1 excluding the gate electrode 611.

In some embodiments, the gate insulation layer 62 is formed on the gate electrode 611 and the upper surface of the base substrate 1 excluding the gate electrode 611 through chemical vapor deposition and further through masking and photoetching treatments. The material of the gate insulation layer 62 includes at least one of silicon nitride and silicon oxide.

Figure 7:
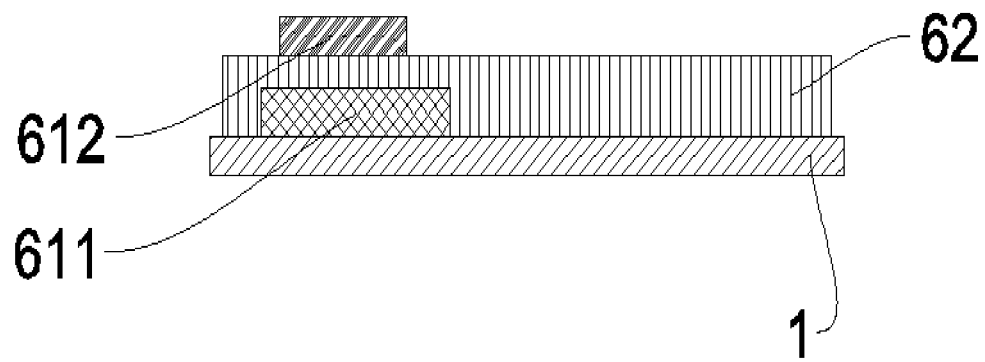
FIG. 7 illustrates a schematic profile diagram corresponding to a step S30 in the method for fabricating the array substrate provided by one embodiment of the present application.

At step S30, as shown in FIG. 7, an active region 612 is formed on the upper surface of the gate insulation layer 62.

In some embodiments, an amorphous silicon layer or a polycrystalline silicon layer is formed on the upper surface of the gate insulation layer 62 through a chemical vapor deposition method. Then, the active region 612 is formed through the masking and photoetching treatments. As an alternative, a polysilicon layer or a metal oxide semiconductor layer is formed on the upper surface of the gate insulation layer 62 through a physical vapor deposition method. Then, the active region 612 is formed through the masking and photoetching treatment. Where the metal oxide includes indium gallium zinc oxide (IGZO), and the active region 612 is located on an upper surface of the gate insulation layer 62 disposed on the upper surface of the gate electrode 611.

Figure 8:
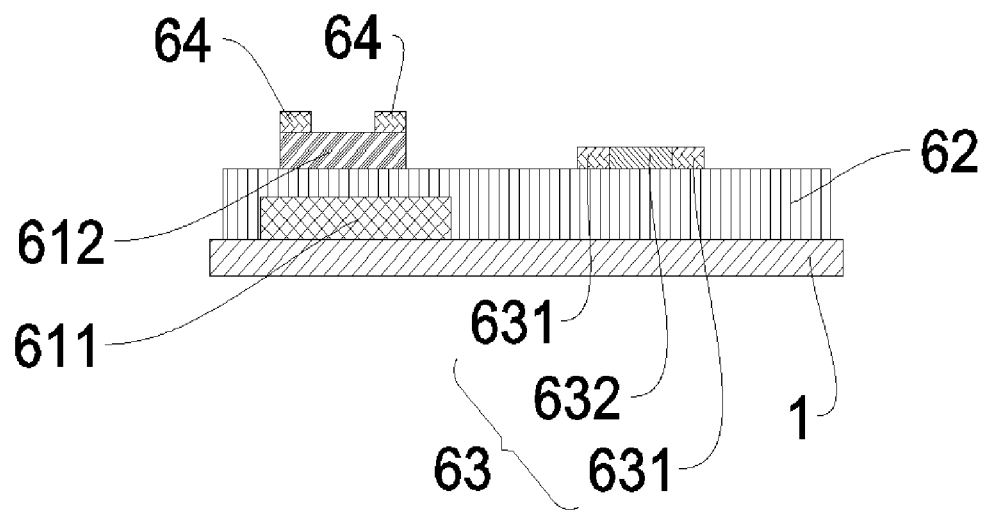
FIG. 8 illustrates a schematic profile diagram corresponding to a step S40 in the method for fabricating the array substrate according to one embodiment of the present application.

At step S40, as shown in FIG. 8, two second doped regions 64 are formed at two ends of the upper surface of the active region 612, and a first doped region 63 is formed in a region of the gate insulation layer 62 excluding the upper surface of the gate insulation layer 62, which are disposed on the upper surface of the gate electrode 611.

In some embodiments, ion doping and ion deposition are performed at the two ends of the upper surface of the active region 612 through the chemical vapor deposition method, the second doped regions 64 are formed through the masking and photoetching treatments. The second doped regions 64 are ohmic contact layers for reducing the contact resistance between the active region 612, and the source electrode 613 and the drain electrode 614. Ions are doped and deposited in the region of the gate insulation layer 62 disposed on the upper surface of the gate electrode 611 and excluding the upper surface of the gate insulation layer 62, and the first doped region 63 is formed through the masking and photoetching treatments.

In one embodiment, forming the two second doped regions 64 at the two ends of the upper surface of the active region 612, and forming the first doped region 63 in a region of the gate insulation layer 62 disposed on the upper surface of the gate electrode 611 and excluding the upper surface of the gate insulation layer 62, includes:

the first doped region 63 includes two first heavily doped regions 631 and a first lightly doped region 632.

Second doped regions 64 are formed at both ends of the upper surface of the active region 612 through the chemical vapor deposition method, and the two first heavily doped regions 631, which have the same shape as the second doped regions 64, are formed in the region of the gate insulation layer 62 disposed on the upper surface of the gate electrode 611 and excluding the upper surface of the gate insulation layer 62.

The first lightly doped region 632 is formed between the two first heavily doped regions 631 using the chemical vapor deposition method.

The first heavily doped regions 631 are formed in the first doped region 63, and the first heavily doped regions 631 are used as the ohmic contact layer for reducing the contact resistance between the two ends of the first lightly doped region 632, and the source electrode 613 and the secondary electrode metal layer 65 connected to the two ends of the first lightly doped region 632 respectively. Where the doping concentration of each first heavily doped region 631 is equal to the doping concentration of the second doped region 64, so that a simplification of the process of chemical vapor deposition and a reduction of the deposition time are facilitated.

In some embodiments, the gas used in the chemical vapor deposition method includes hydrogen phosphide (PH3) and methylsilane (SiO4), a first ratio M of a gas flow of hydrogen phosphide in the first heavily doped regions 631 and the second doped regions 64 to the gas flow of the methylsilane meets a first preset ratio range. A second ratio N of the gas flow of phosphine in the first lightly doped region 632 to the gas flow of the methylsilane meets a second preset ratio range.

Furthermore, the first preset ratio range is set to be 1:2.0≤M≤1:1.5; the second preset ratio range is set to be 1:0.5≤N≤1:0.1. The chemical vapor deposition process can be better controlled through the ratio of the gas flow of the phosphine to the gas flow of the methylsilane in the first preset ratio range and the second preset ratio range, and the doped region having required doping concentration can be obtained.

Figure 9:
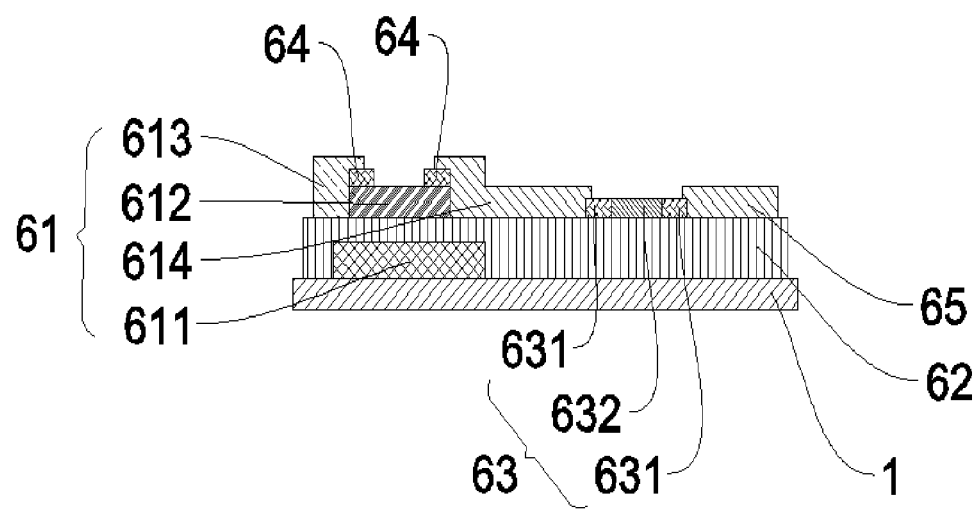
FIG. 9 illustrates a schematic profile diagram corresponding to a step S50 in the method for fabricating the array substrate according to one embodiment of the present application.

At step S50, as shown in FIG. 9, the source electrode 613 is formed on the upper surface of the gate insulation layer 62, the drain electrode 614 is formed on the upper surface of the gate insulation layer 62 between the active region 612 and the first doped region 63, the secondary electrode metal layer 65 is formed on the upper surface of the gate insulation layer 62 adjacent to the first doped region 63. The secondary electrode metal layer 65 and the drain electrode 614 are connected to the two sides of the first doped region 63, respectively.

In some embodiments, the second metal layer is formed on the upper surface of the gate insulating layer 62 through the physical vapor deposition method. The material of the second metal layer includes at least one of aluminum and molybdenum. Then, the source electrode 613 is formed through masking and photoetching treatments. The drain electrode 614 is formed on the upper surface of the gate insulation layer 62 between the active region 612 and the first doped region 63, and the secondary electrode metal layer 65 is formed on the upper surface of the gate insulation layer 62. The second doped region 64 distributed at one end of the upper surface of the active region 612 is connected to the source electrode 613, the second doped region 64 distributed at the other end of the upper surface of the active region 612 is connected to the first end of the drain electrode 614, the second end of the drain electrode 614 is connected to a first end of the first doped region 63, and a second end of the first doped region 63 is connected to the secondary electrode metal layer 65.

Figure 10:
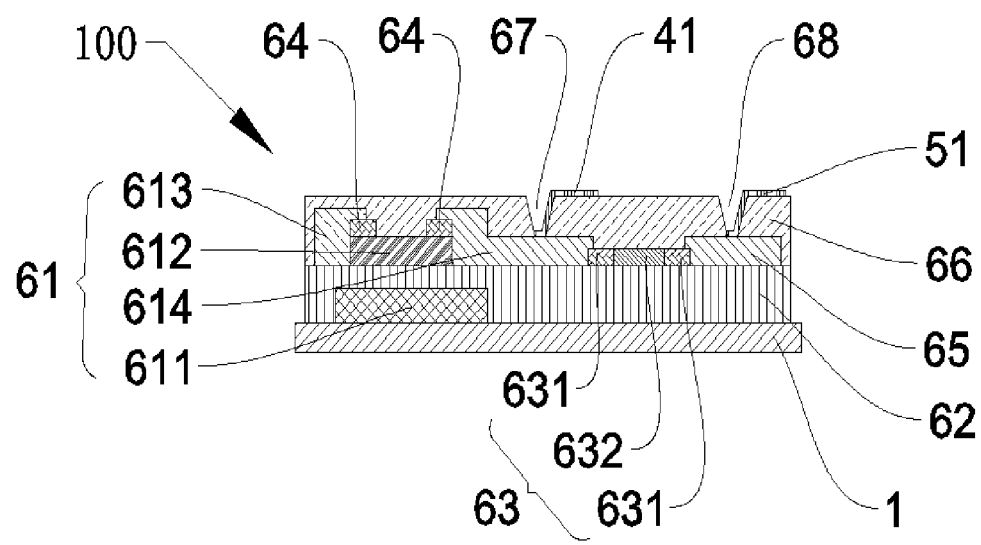
FIG. 10 illustrates a schematic profile diagram corresponding to a step S60 in the method for fabricating the array substrate according to one embodiment of the present application.

At step S60, as shown in FIG. 10, a passivation layer 66 is formed on the source electrode 613, an upper surface of the active region 612 which is not covered by the second doped regions 64, upper surface regions of the second doped regions 64 which are not covered by the source electrode 613 and the drain electrode 614, the drain electrode 614, the first doped region 63, and the secondary electrode metal layer 65.

In some embodiments, an insulating material layer is formed on the source electrode 613, the upper surface of the active region 612 which is not covered by the second doped regions 64, upper surface regions of the second doped regions 64 which are not covered by the source electrode 613 and the drain electrode 614, the drain electrode 614, the first doped region 63 and the secondary electrode metal layer 65 through the chemical vapor deposition method, etc. Then, the passivation layer 66 is formed by performing the masking and photoetching treatments on the insulating material layer. The material of the passivation layer 66 includes at least one of silicon nitride and silicon oxide. Where the passivation layer 66 is provided with a first via 67 penetrating to the drain electrode 614 and a second via 68 penetrating to the secondary electrode metal layer 65. The drain electrode 614 is connected to the primary pixel electrode 41 through the first via 67, and the secondary electrode metal layer 65 is connected to the secondary pixel electrode 51 through the second via 68.

Where, connecting the drain electrode 614 to the primary pixel electrode 41 through the first via hole 67, and connecting the secondary electrode metal layer 65 to the secondary pixel electrode 51 through the second via hole 68 further includes:

A transparent metal layer is formed in the first via hole 67 and the second via hole 68 through a physical vapor deposition method. The material of the transparent metal layer may be indium tin oxide, indium zinc oxide, aluminum zinc oxide. Then, the primary pixel electrode 41 and the secondary pixel electrode 51 in an aperture area are formed through the masking and photoetching treatments. Where the primary pixel electrode 41 is connected to the drain electrode 614 through the first via hole 67, the secondary pixel electrode 51 is connected to the secondary electrode metal layer 65 through the second via hole 68.

As compared to the related art, according to the embodiments of the present application, the following beneficial effects can be achieved:

A method for fabricating the array substrate is provided in the embodiments of the present application, in the structure of the array substrate, the drain electrode of the thin film transistor is directly connected to the primary pixel electrode, and the drain electrode of the thin film transistor is further connected to the secondary pixel electrode through the first doped region. According to the arrangement of the first doped region of the pixel structure with a low doping concentration, the resistance between the drain electrode and the secondary pixel electrode of the thin film transistor is increased due to the low doping concentration of the first doped region, so that the resistance between the drain electrode and the secondary pixel electrode of the thin film transistor is greater than the resistance between the drain electrode and the primary pixel electrode. Since the resistance generated in the first doped region with the low doping concentration between the drain electrode and the secondary pixel electrode of the thin film transistor has a voltage dividing effect on data signal voltage, so that the data signal voltage obtained by the secondary pixel electrode is smaller than the data signal voltage obtained by the primary pixel electrode, the liquid crystal deflection angle of the secondary pixel region is smaller than the liquid crystal deflection angle of the primary pixel region. Thus, one thin film transistor can be used to control 8-domain VA displaying, the number of TFTs and the steps for fabricating the TFTs are reduced while a large-angle viewing angle range is guaranteed, both the complexity of the structure of the pixel structure and the cost of fabrication of the pixel structure are reduced.

According to the display panel having the pixel structure and array substrate described in the embodiments of the present application, only one TFT is used to realize the 8-domain VA display, the number of TFTs and the steps for fabricating the TFT are reduced while the large-angle viewing angle range is guaranteed. The display panel has a low complexity of structure and a low fabrication cost.

It should be understood that, the values of serial numbers of the steps in the aforesaid embodiments do not indicate an order of execution sequences of the steps; instead, the execution sequences of the steps should be determined by functionalities and internal logic of the steps, and thus shouldn't be regarded as limitation to an implementation process of the embodiment of the present application.

In the aforesaid embodiments, the descriptions of the various embodiments are emphasized respectively, regarding a part of one embodiment which has not been described or disclosed in detail, reference can be made to relevant descriptions in other embodiments.

The foregoing embodiments are only intended to explain but not to limit the technical solutions of the present application. Although the present application has been explained in detail with reference to these embodiments, a person of ordinary skilled in the art can understand that, the technical solutions disclosed in the embodiments can also be amended, some technical features in the technical solutions can also be equivalently replaced. The amendments or the equivalent replacements don't cause the essence of the corresponding technical solutions to be deviated from the spirit and the scope of the technical solutions in the embodiments of the present application, and thus should all be included in the protection scope of the present application.

What is claimed is:

1. A pixel structure, comprising:
   a gate electrode disposed on an upper surface of a base substrate;
   a gate insulation layer covering the gate electrode, and the upper surface of the base substrate excluding the gate electrode;
   a source electrode, an active region, a drain electrode, a first doped region and a secondary electrode metal layer which are sequentially disposed on an upper surface of the gate insulation layer in a transverse direction parallel to the base substrate; wherein the active region is arranged in a region on an upper surface of the gate electrode;
   two second doped regions arranged at two ends of an upper surface of the active region, wherein one of the second doped regions arranged at one end of the upper surface of the active region is connected to the source electrode, the other one of the second doped regions arranged at the other end of the upper surface of the active region is connected to the drain electrode, and a doping concentration of the first doped region is less than a doping concentration of each of the second doped regions; and
   a passivation layer covering the source electrode, a portion of the active region exposed to the second doped regions, the two second doped regions, the drain electrode, the first doped region and the secondary electrode metal layer; wherein the passivation layer is provided with a primary pixel electrode and a secondary pixel electrode disposed thereon, the primary pixel electrode is connected to the drain electrode, and the secondary pixel electrode is connected to the secondary electrode metal layer.

2. The pixel structure of claim 1, wherein the first doped region comprises two first heavily doped regions and a first lightly doped region; and
   the two first heavily doped regions are distributed at two ends of the first lightly doped region in the transverse direction parallel to the base substrate, one of the two first heavily doped regions distributed at one end of the first lightly doped region is connected to the drain electrode, and the other one of the two first heavily doped regions distributed at the other end of the first lightly doped region is connected to the secondary electrode metal layer.

3. The pixel structure of claim 2, wherein a doping concentration of each of the first heavily doped regions is equal to a doping concentration of each of the two second doped regions.

4. The pixel structure of claim 2, wherein a doping concentration of each of the first heavily doped regions is greater than a doping concentration of the first lightly doped region.

5. The pixel structure of claim 1, wherein a doping type of the first doping region and a doping type of each of the second doping regions are P-type doping.

6. An array substrate, comprising:
   a base substrate; and
   a plurality of scanning lines, a plurality of data lines, and a plurality of pixel units disposed on the base substrate, wherein the scanning lines and the data lines define a plurality of pixel regions, and each of the plurality of pixel regions comprises a primary pixel region and a secondary pixel region;
   wherein each of the pixel units comprises a pixel structure, and the pixel structure comprises:
   a gate electrode disposed on an upper surface of a base substrate;
   a gate insulation layer covering the gate electrode, and the upper surface of the base substrate excluding the gate electrode;
   wherein the pixel structure further comprises:
   a source electrode, an active region, a drain electrode, a first doped region and a secondary electrode metal layer which are sequentially disposed on an upper surface of the gate insulation layer in a transverse direction parallel to the base substrate; wherein the active region is arranged in a region on an upper surface of the gate electrode;
   two second doped regions at two ends of an upper surface of the active region, wherein one of the second doped regions at one end of the upper surface of the active region is connected to the source electrode, the other one of the second doped regions at the other end of the upper surface of the active region is connected to the drain electrode, and a doping concentration of the first doped region is less than a doping concentration of each of the second doped regions; and
   a passivation layer covering the source electrode, a portion of the active region exposed to the second doped regions, the two second doped regions, the drain electrode, the first doped region and the secondary electrode metal layer; wherein the passivation layer is provided with a primary pixel electrode and a secondary pixel electrode disposed thereon, the primary pixel electrode is connected to the drain electrode, and the secondary pixel electrode is connected to the secondary electrode metal layer;
   wherein the gate electrode is connected to one of the scanning lines, the source electrode is connected to one of the data lines, the primary pixel electrode is arranged in the primary pixel region, and the secondary pixel electrode is arranged in the secondary pixel region.

7. A fabrication method for an array substrate, the method comprising:

forming a gate electrode on an upper surface of a base substrate;

forming a gate insulation layer on the gate electrode and the upper surface of the base substrate excluding the gate electrode;

forming an active region on an upper surface of the gate insulation layer, wherein the active region is located on an upper surface of the gate insulation layer disposed on an upper surface of the gate electrode;

forming two second doped regions at two ends of an upper surface of the active region, and forming a first doped region on the upper surface of the gate insulation layer and being spaced from with the active region and the second doped regions;

forming a source electrode, a drain electrode and a secondary electrode metal layer on the upper surface of the gate insulation layer, wherein one of the second doped regions at one end of the upper surface of the active region is connected to the source electrode, the other one of the second doped regions at the other end of the upper surface of the active region is connected to a first end of the drain electrode, a second end of the drain electrode is connected to a first end of the first doped region, and a second end of the first doped region is connected to the secondary electrode metal layer; and forming a passivation layer on the source electrode, the active region, the two second doped regions, the drain electrode, the first doped region and the secondary electrode metal layer, disposing a primary pixel electrode and a secondary pixel electrode on the passivation layer, connecting the primary pixel electrode with the drain electrode, and connecting the secondary pixel electrode with the secondary electrode metal layer.

8. The fabrication method of claim 7, wherein said forming two second doped regions at two ends of an upper surface of the active region, and forming a first doped region on the upper surface of the gate insulation layer and being spaced from with the active region and the second doped regions comprises:

forming two first heavily doped regions in the first doped region;

forming the two second doped regions at the two ends of the upper surface of the active region using a chemical vapor deposition method, and forming two first heavily doped regions on the upper surface of the gate insulation layer and being spaced from the active region and the second doped region;

forming one first lightly doped region between the two first heavily doped regions using the chemical vapor deposition method, wherein a doping concentration of each of the two first heavily doped regions is equal to a doping concentration of each of the two second doped regions.

9. The fabrication method of claim 8, wherein:

gases used in the chemical vapor deposition method comprise hydrogen phosphide and methylsilane;

a first ratio M of a gas flow in the first heavily doped regions and the second doped regions to a gas flow of the methylsilane meets a first preset ratio range; and the first preset ratio range is expressed as $1:2.0 \leq M \leq 1:1.5$.

10. The fabrication method of claim 9, wherein:

a second ratio N of a gas flow of the phosphine in the first lightly doped region to the gas flow of the methylsilane meets a second preset ratio range; and the second preset ratio range is expressed as $1:0.5 \leq N \leq 1:0.1$.

11. The array substrate of claim 6, wherein the first doped region comprises two first heavily doped regions and a first lightly doped region; and the two first heavily doped regions are distributed at two ends of the first lightly doped region in the transverse direction parallel to the base substrate, one of the two first heavily doped regions distributed at one end of the first lightly doped region is connected to the drain electrode, and the other one of the two first heavily doped regions distributed at the other end of the first lightly doped region is connected to the secondary electrode metal layer.

12. The array substrate of claim 11, wherein:

a doping concentration of each of the first heavily doped regions is equal to a doping concentration of each of the two second doped regions.

13. The array substrate of claim 11, wherein:

a doping concentration of each of the first heavily doped regions is greater than a doping concentration of the first lightly doped region.

14. The array substrate of claim 6, wherein:

a doping type of the first doping region and a doping type of each of the second doping regions are P-type doping.

* * * * *